United States Patent
Hiraishi et al.

[11] Patent Number: 5,938,843
[45] Date of Patent: Aug. 17, 1999

[54] APPARATUS FOR PULLING UP CRYSTAL BODIES

[75] Inventors: Yoshinobu Hiraishi; Mitsunori Kawabata; Shoei Kurosaka; Hiroshi Inagaki, all of Kanagawa, Japan

[73] Assignee: Komatsu Electronic Metals Co.,Ltd., Kanagawa, Japan

[21] Appl. No.: 09/048,789

[22] Filed: Mar. 27, 1998

[30] Foreign Application Priority Data

Mar. 27, 1997 [JP] Japan .................................. 9-075344

[51] Int. Cl.[6] .................................................. C30B 35/00
[52] U.S. Cl. .......................................... 117/218; 117/911
[58] Field of Search ................................ 114/14, 15, 35, 114/218, 911

[56] References Cited

U.S. PATENT DOCUMENTS

| | | | |
|---|---|---|---|
| 5,126,113 | 6/1992 | Yamagishi et al. | 117/911 |
| 5,173,270 | 12/1992 | Riday et al. | 117/218 |
| 5,725,660 | 3/1998 | Hiraishi | 117/14 |

*Primary Examiner*—Felisa Hitesheu
*Attorney, Agent, or Firm*—Sughrue, Mion, Zinn, MacPeak & Seas, PLLC

[57] ABSTRACT

This invention provides a apparatus for pulling up crystal bodies, which is capable of firmly clamping and safely pulling up large-diameter crystal bodies regardless of the location of the necked portions formed on the top of the crystal bodies. A large-diameter portion 52 and a necked portion 51 are formed on the top of the crystal body 5. The swaying members 12 of the necked-portion clamp 1 are capable of swaying upward and downward without restraint. The stopper 14 restrains the swaying members 12 to sway below the horizontal plane on which the swaying members 12a are located. The large-diameter portion 52 can pass through the clamp body 11 by lowering the necked-portion clamp 1 to sway the swaying members 12 upward. The swaying members 12 close to clamp the necked portion 51 when the necked-portion clamp 1 reaches a location near the necked portion 51. The distance between the necked-portion clamp 1 and the seed-crystal 3 is adjustable.

9 Claims, 4 Drawing Sheets

APPARATUS FOR PULLING UP CRYSTAL BODIES

BACKGROUND OF THE INVENTION

1. Field of the Invention

This invention relates to an apparatus for pulling up crystal bodies, such as silicon single crystals, by the CZ method, and especially relates to an apparatus for safely pulling up heavy crystal bodies.

2. Description of Related Art

In the process of pulling up crystal bodies, such as silicon single crystals, by the CZ method, a seed crystal installed within a seed-crystal holder is suspended by wires and dipped into the melt. Then, the seed crystal is pulled up from the melt by rotating and winding up the wires.

In recent years, the need for large-diameter semiconductor wafers is increasing. Following the enlargement of crystal bodies, weight of an individual single crystal is increasing. For example, the weight of a crystal body with 300 mm diameter can reach a value of 150 Kg. In the process of pulling up conventional lightweight crystal bodies, the weight of the crystal body being pulled up is supported by the connection between the seed crystal and the crystal body only. However, it is difficult to support the upper part of the heavy crystal body by only the connection between the seed crystal and the crystal body. Especially the load is concentrated at a so-called dash neck, a small-diameter portion formed so as to prevent any dislocation caused by the seed crystal from being transmitted to f the crystal body on being pulling up, thereby the load may cause the dash neck to break and results the crystal body being dropped. This not only incurs the loss of the crystal body but also considerable damage to the pulling up apparatus.

To prevent the dropping of a crystal body, a crystal pulling up apparatus was disclosed in Japanese Patent Publication Laid Open (JP-A-) HEI 7-10300. In the single-crystal pulling up apparatus disclosed in Japanese Patent Publication (JP-B) HEI 7-10300, a necked portion is formed on the top of a crystal body beforehand, and the necked portion is clamped by several "V shaped" holding levers extending from the seed crystal holder.

However, for a crystal body of 300 mm diameter, the distance from the seed crystal holder to the necked portion is over 500 mm. Therefore, the above "V shaped" holding levers need to be longer than 500 mm. At this length, it is difficult to achieve enough strength to support the weight of the crystal body.

Furthermore, it is quite difficult to maintain an unvarying distance from the seed crystal holder to the necked portion to match the length of the holding levers.

SUMMARY OF THE INVENTION

In view of the above drawbacks, the object of this invention is to provide an apparatus for pulling up crystal bodies, which is capable of firmly clamping and safely pulling up large-diameter crystal bodies regardless the location of the necked portions formed on the top of the crystal bodies.

According to this invention, an apparatus for pulling up crystal bodies is employed in the process for pulling up a crystal body under a seed crystal. The pulling up apparatus comprises means for forming a large-diameter portion and a small-diameter portion (a necked portion) and growing the crystal body from beneath the necked portion to a preset diameter, and means for clamping the upper necked portion. The apparatus for pulling up crystal bodies characterized in that: the clamping means is capable of extending outward to allow the large-diameter portion to pass therethrough and subsequently retracting inward to retain the large-diameter portion after the large-diameter portion has passed therethrough, and means for adjusting the distance between the clamping means and the seed-crystal holder is provided.

Furthermore, the above clamping means constituted by a large-diameter edge allowing the large-diameter portion to pass therethrough, a small-diameter edge having a diameter smaller than that of the large-diameter portion and larger than that of the small-diameter portion, and means for extending the small-diameter edge outward so as to allow the large-diameter portion to pass therethrough, and subsequently retracting the small-diameter edge inward to retain the large-diameter portion after the large-diameter portion has passed therethrough, wherein the distance between the clamping means and the seed-crystal holder is adjustable.

To respond to the increase in weight of an individual semiconductor ingot caused by the enlargement of crystal bodies, a large-diameter portion and a small-diameter portion (a necked portion) are formed on the top of the crystal body, so that dropping of the crystal body can be prevented by clamping the necked portion. Since that the distance between the necked portion and the seed-crystal holder varies for all crystal bodies; it is difficult to firmly hold all necked portions by conventional clamping technologies. In light of the above, according to this invention, the distance between the clamping means for the necked portion and the seed-crystal holder is set to be adjustable, and the clamping means is directed to have a satisfactory clamping function. By this arrangement, large crystal bodies of a diameter greater than, for example, 300 mm can be firmly and safely pulled up.

Furthermore, to prevent an increase of the load imposed on the dash neck formed below the seed-crystal following the weight increase of the crystal body, the weight imposed on the seed-crystal holder and the weight imposed on the clamping means for the necked portion are respectively detected. Moreover, the weight imposed on the clamping means for the necked portion is controlled according to the above detection results.

A first aspect of the present invention is an apparatus for pulling up crystal bodies, which comprises:

means for pulling up a crystal body under a seed crystal, so as to grow a large-diameter portion, a small-diameter portion as a necked portion and the crystal body having a preset diameter from beneath the necked portion successively means for clamping the necked portion, comprises an adjustable clamp portion, inner diameter of which is capable of extending outward to allow the large-diameter portion to pass therethrough, and subsequently retracting inward to retain the large-diameter portion after the large-diameter portion has passed therethrough; and means for adjusting the distance between the clamping means and the seed-crystal holder.

A second aspect of the apparatus is an apparatus for pulling up crystal bodies according to the first aspect, wherein the clamping means comprises a large-diameter edge allowing the large-diameter portion to pass therethrough, a small-diameter edge having a diameter smaller than that of the large-diameter portion and larger than that of the small-diameter portion, and means for extending the small-diameter edge outward so as to allow the large-diameter portion to pass therethrough, and subsequently retracting the small-diameter edge inward to retain the large-diameter portion after the large-diameter portion has passed therethrough.

As described above, inner edge on the opening of the clamp body is named a large diameter edge, inner edge of the opening surrounded by the free end of the arms is named a small diameter edge.

A third aspect of the apparatus is an apparatus for pulling up crystal bodies according to the second aspect, wherein the clamping means comprises:

a clamp body substantially formed in a ring shape, inner diameter of which is capable of allowing outward to allow the large-diameter portion to pass therethrough; and a plurality of swaying members, one ends of which are pivotally supported by the clamp body so as to allow the swaying members to sway upward and downward without restraint, the edge of the swaying members extend outward to allow the large-diameter portion to pass therethrough by swaying upward, and the edge of the swaying members retracts inward by swaying downward to retain the large-diameter portion after the large-diameter portion has passed therethrough.

A fourth aspect of the apparatus is an apparatus for pulling up crystal bodies according to the first aspect, wherein the clamping means is suspended by at least two wires, and the clamping means is capable to move upward or downward by the winding operation of the wires.

A fifth aspect of the apparatus is an apparatus for pulling up crystal bodies according to the first aspect, which further comprised a first weight detecting means for detecting a weight loaded on the seed-crystal holder by detecting a size of the crystal body being pulled up; and a second weight detecting means for detecting a weight loaded on the clamping means for clamping the necked portion;

a means for calculating a sum of the detected value by the first and second weight detecting means thereby the growth of the crystal body is controlled according to the detected weights by the first and second weight detecting means.

A sixth aspect of the apparatus is an apparatus for pulling up crystal bodies according to the first aspect, which further comprise:

a first winding means for winding up the seed-crystal wire;

a second winding means for winding up the clamping-means wires used for suspending the clamping means;

a first weight sensor for detecting a weight loaded on the first winding means;

a second weight sensor for detecting a weight loaded on the second winding means; and a means for controlling the growth of the crystal body based on the detected values by first and second weight sensors.

A seventh aspect of the apparatus is an apparatus for pulling up crystal bodies according to the sixth aspect, wherein the weight loaded on the first winding means and the weight loaded on the second winding means for winding up the seed-crystal wire can be detected respectively, and further comprising a means for controlling the weight loaded on the seed-crystal holder according to the respective detected weights by raising the above clamping means.

An eighth aspect of the apparatus is an apparatus for pulling up crystal bodies, which comprises:

means for pulling up a crystal body under a seed crystal, so as to grow a large-diameter portion, a small-diameter portion as a necked portion and the crystal body having a preset diameter from beneath the necked portion successively;

means for clamping the necked portion, which comprises:

clamp body substantially formed in a ring shape, inner diameter of which is capable of allowing the large-diameter portion to pass therethrough;

plurality of arms, each of which is pivoted at one end with the clamp body and has a free end of the arm being able to move from the upper portion of the pivot to the inward horizontal portion of the pivot upwardly and downwardly;

a stopper formed at the bottom of the inner peripheral surface of the clamp body to prevent the arms from descending below the stopper; and a means for raising/lowering the clamp body so that the opening surrounded by the free ends of the arms has a diameter larger than that of the small diameter portion and smaller than that of the large diameter portion when the arms are prevented from descending by the stopper, the free ends of the arms are expanded outward so as to allow the large-diameter portion to pass therethrough by lowering the clamp body after forming the large diameter portion of the crystal body, the free ends of the arms are rotated downward by the weight of the arms again and stopped at a horizontal attitude by the stopper after passing the large diameter portion of the crystal body, the opening surrounded by the free ends of the arms has a diameter smaller than that of the large diameter portion and the crystal body is pulled up.

A ninth aspect of the apparatus is an apparatus according to the eighth aspect, wherein the arms are disposed along an inner peripheral surface of the clamp body.

BRIEF DESCRIPTION OF THE DRAWINGS

The present invention can be more fully understood by reading the subsequent detailed description and examples with references made to the accompanying drawings, wherein.

DETAILED DESCRIPTION OF THE PREFERRED EMBODIMENT

The following are descriptions of embodiments with reference made to the above drawings.

Embodiment One

Figure 1:
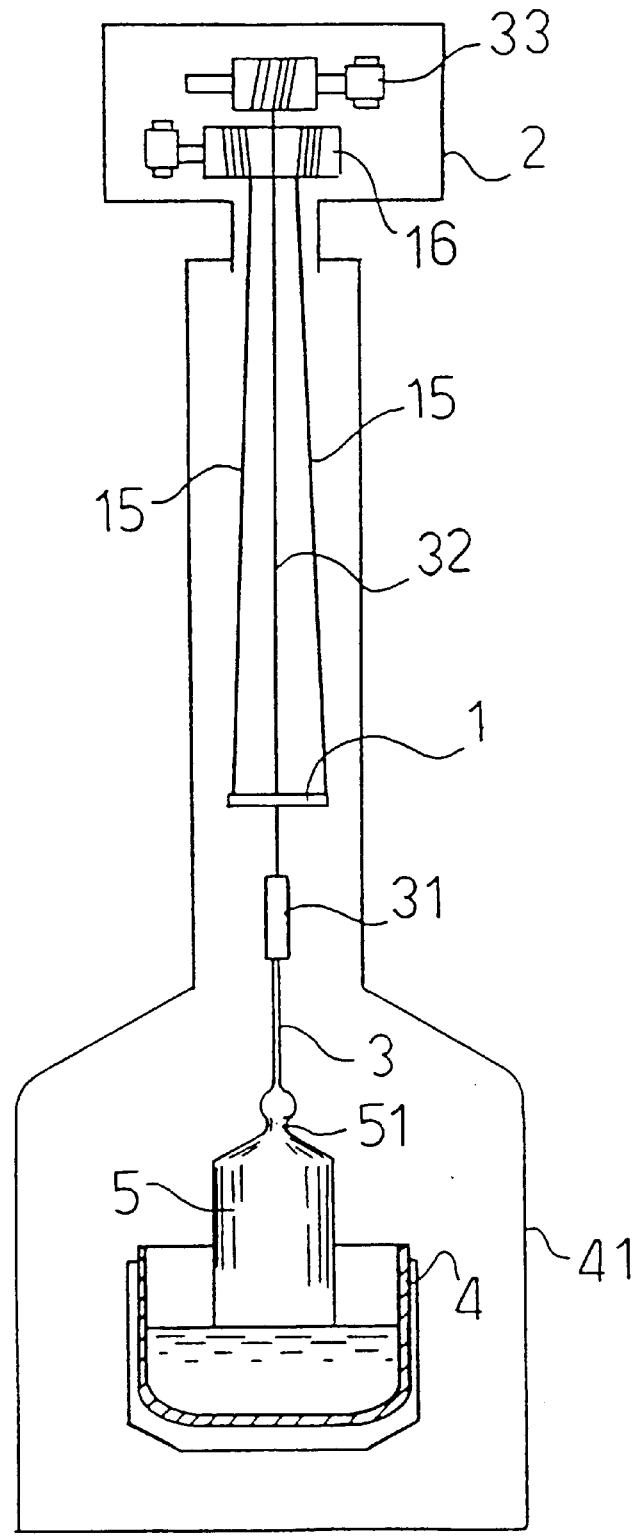
FIG. 1 is a schematic drawing showing an outline structure of the crystal-body-pulling up apparatus according to this invention.
Figure 2:
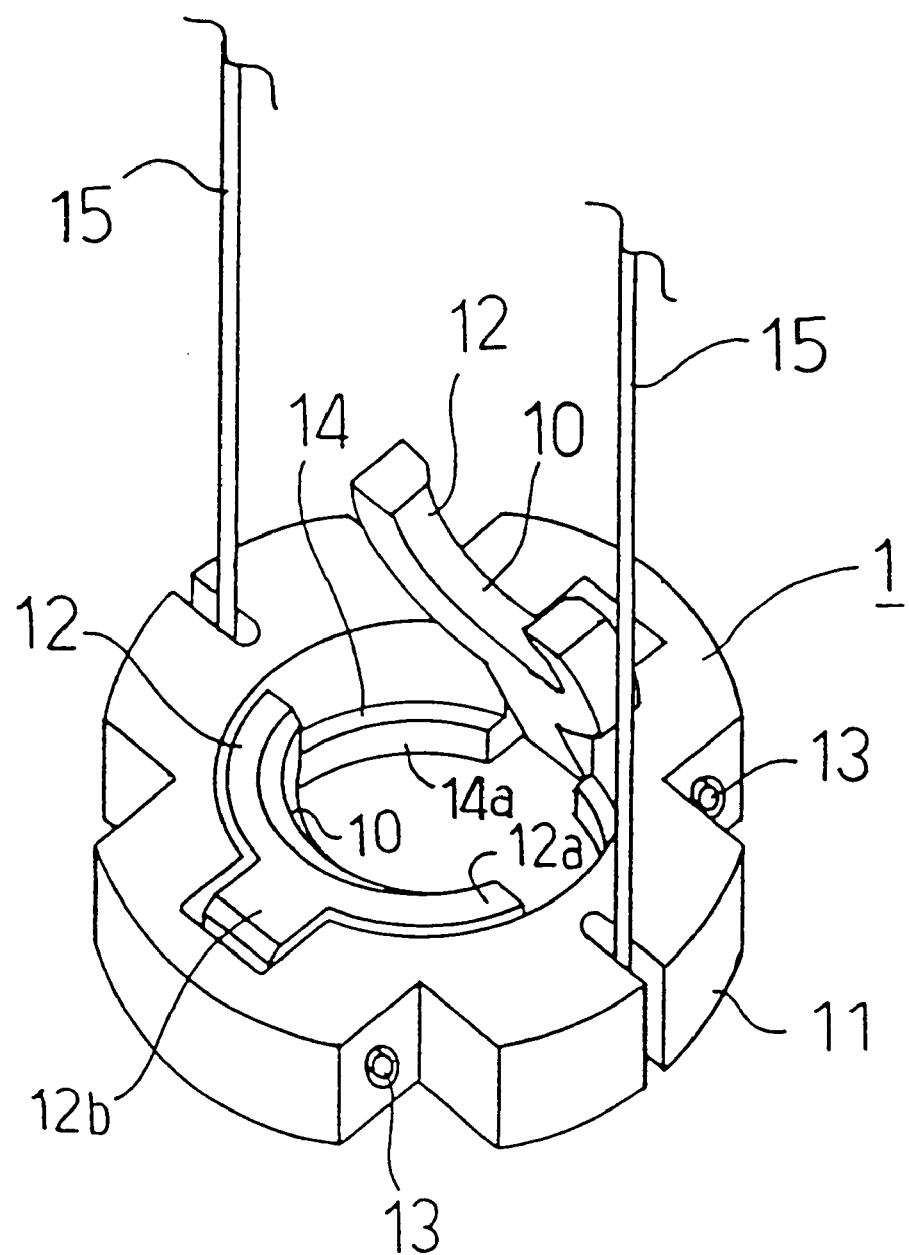
FIG. 2 is a partial perspective view showing the structure of a first embodiment of the clamping means according to this invention.

FIG. 1 is a schematic drawing showing an outline structure of the crystal-body-pulling up apparatus according to this invention. FIG. 2 is a partial perspective view showing the structure of a first embodiment of the clamping means according to this invention. FIGS. 3a, 3b, 3c, 3d are partial cross-sectional views showing the method for clamping a crystal body by employing the first embodiment of the clamping means according to this invention.

As shown in FIG. 1, the pulling up apparatus of this embodiment consists of a seed crystal 3 for pulling up a crystal body 5 from a melt of raw material in a crucible 4; a seed-crystal holder 31 for holding the seed crystal 3 at its lower end; a seed-crystal wire 32 for suspending the seed-crystal holder 31; a first winding apparatus 33 for winding up the seed-crystal wire 32; a necked-portion clamp 1 for clamping the necked portion 51 formed on the top of the crystal body 5 as a holding means; two necked-portion clamp wires 15 for suspending the necked-portion clamp 1; a second winding apparatus 16 for winding up the necked-portion clamp wires 15; a airtight chamber 2 for accommodating the first winding apparatus 33 and the second winding apparatus 16 and rotating them. The airtight chamber 2 communicates with a chamber 41 in which a crucible 4 is installed.

As shown in FIG. 2, the necked-portion clamp 1 consists of a clamp body 11 substantially formed in a ring shape; two swaying members 12, disposed at the inner peripheral rim of the clamp body 11, each of which is pivoted at one end by a pin 13 and capable of swaying upward and downward. The clamp body 11 is affixed at the lower ends of the necked-portion clamp wires 15.

The swaying member 12 is in a form of an essential "Y" shape consisting of a curved portion 12a and a straight portion 12b extended outward from the center of the curved portion 12a, the two curved portions 12a are oppositely disposed so as to form the inner rim of the small-diameter edge 10 for clamping the necked portion 51 of the crystal body 5. The inner rim of the small-diameter edge 10 is of the size allowing the seed-crystal holder 31, the seed crystal 3, and the necked portion 51 with an ordinary size to pass therethrough.

A ring-shaped stopper 14 is formed at the bottom of the inner peripheral surface of the clamp body 11 to prevent the swaying members 12 from descending below the stopper 14. The inner peripheral surface of the stopper 14 is taken as the large-diameter edge 14a allowing the large-diameter portion 52 of the crystal body 5 to pass therethrough.

As shown in FIG. 1, the necked-portion clamp 1 is suspended by two necked-portion clamp wires 15 each of which is wound up at the same speed and simultaneously by a second winding apparatus 16. The grooves for guiding the necked-portion clamp wires 15 are formed in symmetry to the vertical centerline of the necked-portion clamp 1 so that shifting of the vertical centerline of the necked-portion clamp 1 can be prevented and the necked-portion clamp 1 can be kept at a horizontal attitude during the pulling up operation.

The seed-crystal wire 32 for suspending the seed-crystal holder 31 passes through the essential center of the necked-portion clamp 1 and can be wound up by the first winding-up apparatus 33.

Each of the first winding apparatus 33 and the second winding apparatus 16 is capable of detecting the weights of the wire and the article suspended by the wire, and the weights detected are inputted into and processed by a control device (not shown). By this arrangement, the operation of the pulling up apparatus including the winding up speeds of the wires is controlled as described hereinafter.

The following is a description of the operation of the pulling up apparatus according this invention.

Figure 3A:
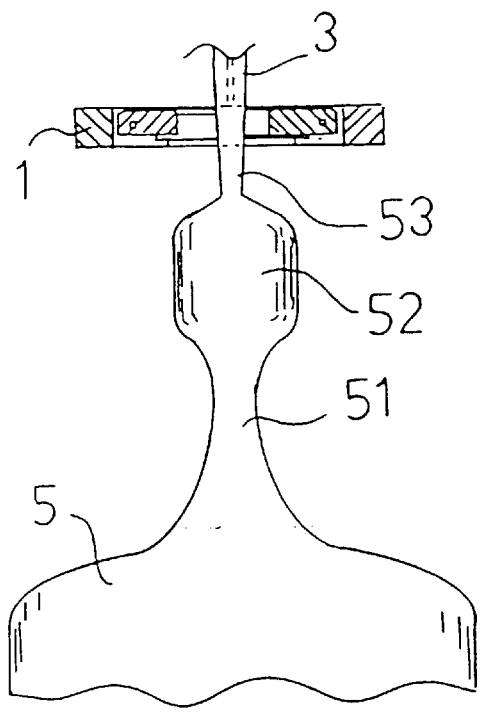
FIGS. 3a, 3b, 3c, 3d are partial cross-sectional views showing the method for clamping a crystal body by employing the first embodiment of the clamping means according to this invention.

As shown in FIG. 3a, in the pulling up apparatus according this invention, the large-diameter portion 52 is formed beneath the dash neck 53 located at the lower end of the seed crystal 3, and a small-diameter necked portion 51 is formed beneath the large-diameter portion 52. Thereafter, a crystal body 5 with a preset diameter is pulled up under the necked portion 51.

In this embodiment, the diameter of the crystal body is set to be 307 mm, the diameter of the large-diameter portion 52 is set to be 30 mm, and the diameter of the necked portion 51 is set to be 17 mm. Furthermore, it is preferred that the diameter of the large-diameter portion 52 be larger than 10 mm. For reasons of strength, the diameter and the length of the necked portion 51 are preferably both greater than 5 mm.

At the beginning of pulling up operation, the weight of the crystal body 5 is supported by a seed-crystal wire 32 (not shown in FIGS. 3a, 3b, 3c, and 3d). After the large-diameter portion 52 and the necked portion 51 have been formed, the crystal body 5 with a diameter 307 mm is steadily pulled up. At the time the weight imposed on the seed-crystal wire 32 reaches 75 Kg, the necked-portion clamp 1 is driven to descend.

Figure 3C:
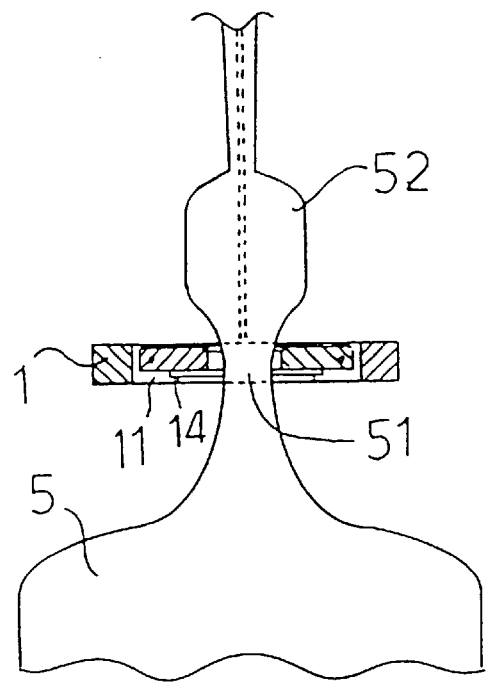
Figure 3B:
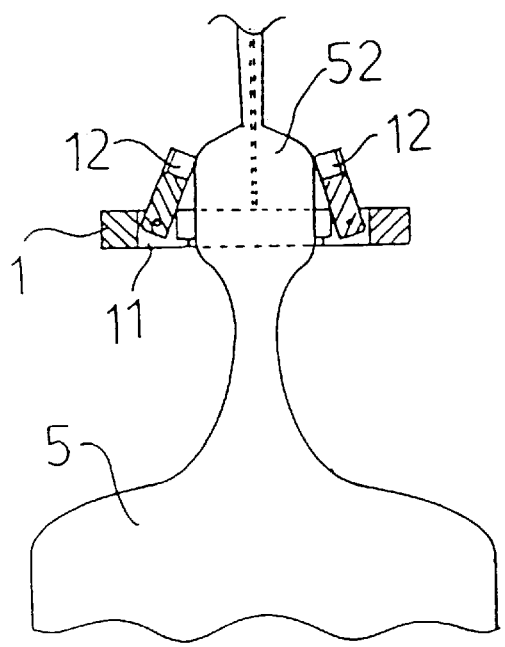

As shown in FIG. 3b, when the top surface of the large-diameter portion 52 of the crystal body 5 touches the swaying members 12 of the necked-portion clamp 1 during the descent of the necked-portion clamp 1, the swaying members 12 as plurality of arms are raised and swayed upward and become penetrable. By this, the large-diameter portion 52 can pass through the clamp body 11.

As shown in FIG. 3c, when the large-diameter portion 52 has passed through the clamp body 11 entirely and the necked-portion clamp 1 descends to reach the necked portion 51, the swaying members 12 sway downward and stop at the stopper 14 (see FIG. 2).

Figure 3D:
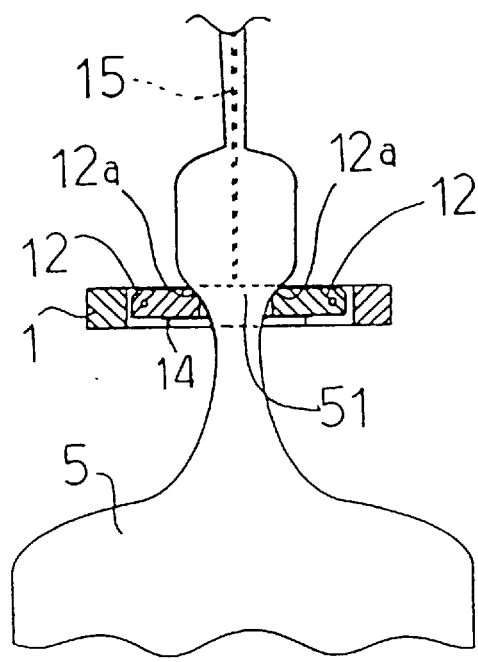

As shown in FIG. 3d, if the winding speed of the necked-portion clamp wires 15 is increased, the curved portions 12a of the swaying members 12 will touch the necked portion 51, and the swaying members 12 could not sway to open by the restraint of the stopper 14. Therefore, the necked-portion clamp 1 is brought to support the weight of the crystal body 5.

Thereafter, the weight imposing on the necked-portion clamp 1 is increased. To keep the weight imposed on the seed-crystal wire 32 at a preset value (in this embodiment, 50 Kg), the weight imposed on the necked-portion clamp 1 is increased following the growth of the crystal body 5 after the weight imposed on the seed-crystal wire 32 reaches the preset value. The reason is that if the weight imposed on the seed-crystal wire 32 is removed, then the seed-crystal wire 32 will loosen. This will destroy the winding operation of the necked-portion clamp wires 15, and pose the danger of breaking the portion near the dash neck 53. Thus, the above pulling load with a preset value is kept imposed on the seed-crystal wire 32.

The control of each apparatus is automatically performed, therefore the variation of the pulling up speed caused by the shifting of the load from the seed-crystal wire 32 to the necked-portion clamp 1 can be restricted to a value less than 10%. The influence induced by the 10% variation in the pulling up speed onto the diameter of the crystal body is less than 1%. This will not cause any problem for the products.

When the crystal body is ejected from the necked-portion clamp 1, the crystal body is loaded on the supporting plate and then the swaying members 12 are raised, swayed upward and a diameter of the small-diameter edge 10 of the necked-portion clamp 1 become larger and the large-diameter portion 52 of the crystal body 5 passes trough the small-diameter edge 10.

Embodiment Two

Figure 4:
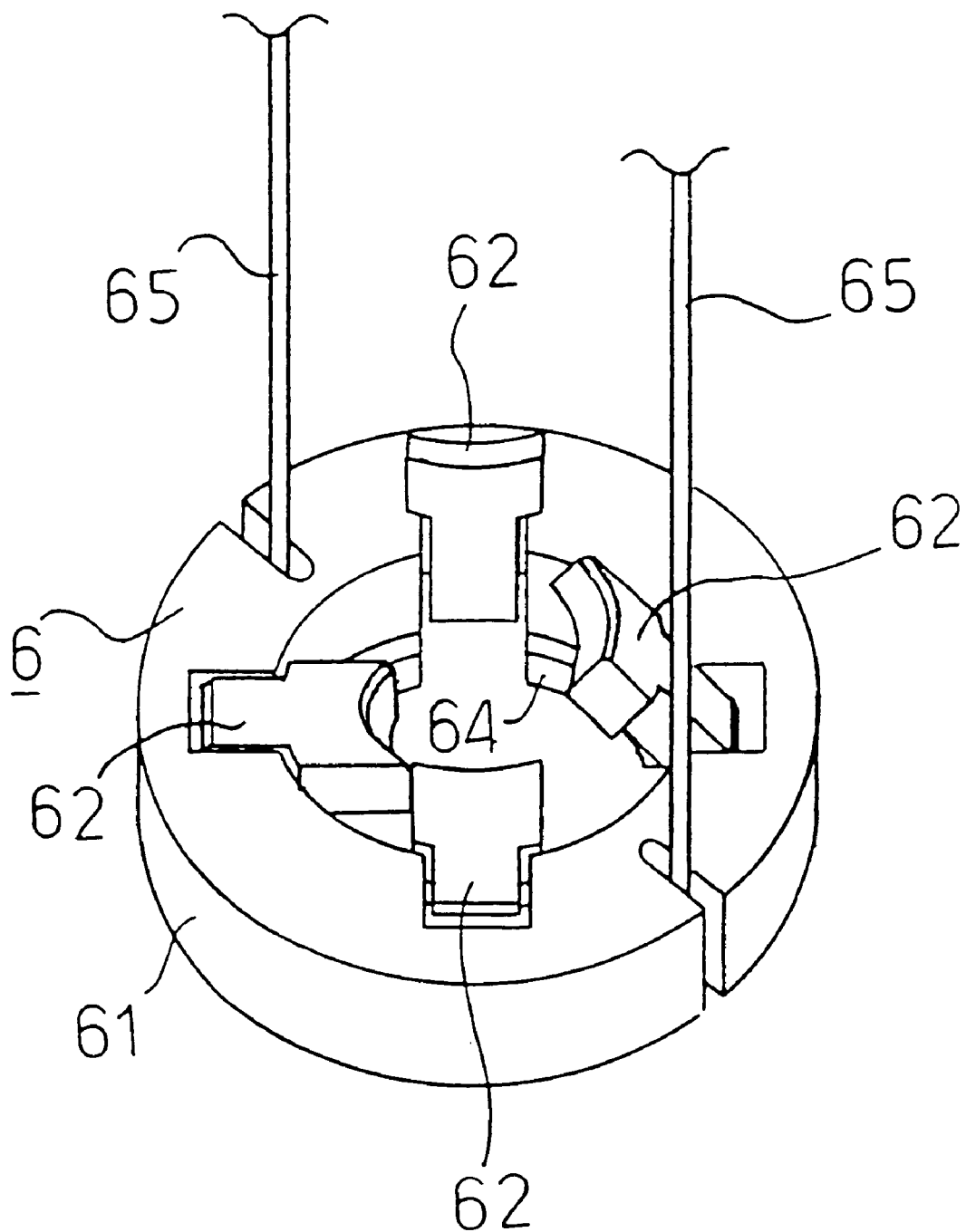
FIG. 4 is a partial perspective view showing the structure of a second embodiment of the clamping means according to this invention.

FIG. 4 is a partial perspective view showing the structure of a second embodiment of the necked-portion clamp.

In the above first embodiment of the necked-portion clamp 1, the swaying member 12 consists of a curved portion 12a and a straight portion 12b. However, in this embodiment, the necked portion is clamped by a plurality of swaying members constructed by straight portions disposed in a radial manner.

As shown in FIG. 4, the second embodiment of the necked-portion clamp 6 consists of a ring-shaped clamp body 61 and four swaying members 62 disposed at the inner peripheral rim of the clamp body 61 in radial directions. The clamp body 61 is affixed at the lower ends of the necked-portion clamp wires 65.

Each swaying member 62 is restrained to descend further by the stopper 64 formed at the bottom of the inner peripheral surface of the clamp body 61. The distal ends of the swaying members 62 are of a curved shape so as to clamp the necked portion of the crystal body (not shown) when the swaying members 62 are directed to close.

By this arrangement, the swaying members 62 of this embodiment can firmly clamp the crystal body as in the first embodiment.

Furthermore, the opening and closing of the small-diameter edges of the above embodiments are performed by the aid of a swaying mechanism. However, it is not restricted to the using of the above mechanism. An equivalent purpose can be achieved by employing a mechanism provided with sliders capable of moving in a horizontal plane and having an automatic locking function during the closing operation subsequent to an opening operation.

Furthermore, the opening and closing of the above small-diameter edges do not perform the clamping of the necked portion. Actually, several parts of a small-diameter edge, which as a whole construct a ring-shaped necked-portion clamp, perform the clamping of the necked portion. Providing means for dividing and recombining the necked-portion clamp can achieve the same purpose.

The structure of this invention has been illustrated as the above, the following effects can thus be obtained.

(i) The capacity of clamping a crystal body is enhanced by the solid structure of this invention. Therefore, even a large-diameter crystal body can also be firmly clamped and pulled up safely.

(ii) The clamping of a crystal body can be performed firmly in a flexible way regardless of the location of the necked portion.

(iii) Controlling the winding operation of the wires can prevent breakage of the dash neck.

What is claimed is:

1. An apparatus for pulling up crystal bodies comprising:
   means for pulling up a crystal body under a seed crystal so as to grow a large-diameter portion, a small-diameter portion as a necked portion, and the crystal body having a preset diameter successively;
   means for clamping the necked portion, comprises an adjustable clamp portion, inner diameter of which is capable of extending outward to allow the large-diameter portion to pass therethrough, and subsequently retracting inward to retain the large-diameter portion after the large-diameter portion has passed therethrough; and
   means for adjusting the distance between the clamping means and the seed-crystal holder.

2. An apparatus for pulling up crystal bodies comprising:
   means for pulling up a crystal body under a seed crystal so as to grow a large-diameter portion, a small-diameter porting as a necked portion, and the crystal body having a resent diameter successively; and
   means for clamping the necked portion, comprises and adjustable clamp portion, inner diameter of which is capable of extending outward to allow the large-diameter portion to pass therethrough, and subsequently retracting inward to retain the large-diameter portion after the large-diameter portion has passed therethrough;
   wherein
   the clamping means further comprises;
   a large-diameter circular edge allowing the large-diameter portion to pass therethrough; and
   a small-diameter circular edge having a diameter smaller than that of the large-diameter portion and larger than that of the small-diameter portion;
   the small-diameter circular edge can be extended outward to allow the large-diameter portion to pass therethrough, and subsequently can be retracted inward to retain the large-diameter portion after the large-diameter portion has passed therethrough.

3. An apparatus for pulling up crystal bodies comprising:
   means for pulling up a crystal body under a seed crystal so as to grow a large-diameter portion, a small-diameter porting as a necked portion, and the crystal body having a resent diameter successively; and
   means for clamping the necked portion, comprises and adjustable clamp portion, inner diameter of which is capable of extending outward to allow the large-diameter portion to pass therethrough, and subsequently retracting inward to retain the large-diameter portion after the large-diameter portion has passed therethrough;
   wherein
   the clamping means further comprises:
   a clamp body substantially formed in a ring shape, inner diameter of which is capable of allowing the large-diameter portion to pass therethrough; and
   a plurality of swaying members, one end of which are pivotally supported by the clamp body to allow the swaying members to sway upward and downward without restraint, the edge of the swaying members extend outward to allow the large-diameter portion to pass therethrough by swaying upward, and the edge of the swaying members retracts inward by swaying downward to retain the large-diameter portion all around forming a circle around the neck after the large-diameter portion has passed therethrough.

4. An apparatus for pulling up crystal bodies comprising:
   means for pulling up a crystal body under a seed crystal so as to grow a large-diameter portion, a small-diameter porting as a necked portion, and the crystal body having a resent diameter successively; and
   means for clamping the necked portion, comprises and adjustable clamp portion, inner diameter of which is capable of extending outward to allow the large-diameter portion to pass therethrough, and subsequently retracting inward to retain the large-diameter portion after the large-diameter portion has passed therethrough;
   wherein
   the clamping means is suspended by at least two wires, and the clamping means is capable of moving upward and downward by the winding operation of the wires.

5. An apparatus for pulling up crystal bodies comprising:

means for pulling up a crystal body under a seed crystal so as to grow a large-diameter portion, a small-diameter porting as a necked portion, and the crystal body having a resent diameter successively; and means for clamping the necked portion, comprises and adjustable clamp portion, inner diameter of which is capable of extending outward to allow the large-diameter portion to pass therethrough, and subsequently retracting inward to retain the large-diameter portion after the large-diameter portion has passed therethrough;

further comprising:

a first weight detecting means for detecting a weight loaded on the seed-crystal holder by detecting a size of the crystal body being pulled up;

a second weight detecting means for detecting a weight loaded on the clamping means for clamping the necked portion; and a means for calculating a sum of the detected value by the first and the second weight detecting means thereby the growth of the crystal body is controlled according to the detected weights by the first and the second weight detecting means.

6. An apparatus for pulling up crystal bodies comprising:

means for pulling up a crystal body under a seed crystal so as to grow a large-diameter portion, a small-diameter porting as a necked portion and the crystal body having a resent diameter successively; and means for clamping the necked portion, comprises and adjustable clamp portion, inner diameter of which is capable of extending outward to allow the large-diameter portion to pass therethrough, and subsequently retracting inward to retain the large-diameter portion after the large-diameter portion has passed therethrough;

further comprising:

a first winding means for winding up the seed-crystal wire;

a second winding means for winding up the clamping-means wires used for suspending the clamping means;

a first weight sensor for detecting a weight loaded on the first winding means;

a second weight sensor for detecting a weight loaded on the second winding means; and a means for controlling the growth of the crystal body based on the detected values by first and second weight sensors.

7. The apparatus for pulling up crystal bodies as claimed in claim 6, wherein the weight loaded on the first winding means and the weight loaded on the second winding means for winding up the seed-crystal wire can be detected independently, and further comprising a means for controlling the weight loaded on the seed-crystal holder according to the respective detected weights by raising the clamping means.

8. An apparatus for pulling up crystal bodies comprising:

means for pulling up a crystal body under a seed crystal, so as to grow a large-diameter portion, a small-diameter portion as a necked portion and the crystal body having a preset diameter successively; and means for clamping the necked portion, which comprises:

clamp body substantially formed in a ring shape, inner diameter of which is capable of allowing the large-diameter portion to pass therethrough;

plurality of arms, each of which is pivoted at one end with the clamp body a free end of the arm being able to move from the upper portion of the pivot to the inward horizontal portion of the pivot upwardly and downwardly;

a stopper formed at the inner peripheral surface of the clamp body to prevent the arms from descending below the stopper; and a means for raising/lowering the clamp body so that the opening surrounded by the free ends of the arms has a diameter larger than that of the small diameter portion and smaller than that of the large diameter portion when the arms are prevented from descending by the stopper, wherein the free ends of the arms are expanded outward so as to allow the large-diameter portion to pass therethrough by lowering the clamp body after forming the large diameter portion of the crystal body, and the free ends of the arms are rotated downward by the weight of the arms again and stopped at a horizontal attitude by the stopper after passing the large diameter portion of the crystal body, the opening surrounded by the free ends of the arms has a diameter smaller than that of the large diameter portion and the crystal body is pulled up.

9. The apparatus for pulling up crystal bodies as claimed in claim 8, wherein the arms are disposed along an inner peripheral surface of the clamp body.

* * * * *